(12) United States Patent
Knoth et al.

(10) Patent No.: US 10,054,618 B2
(45) Date of Patent: Aug. 21, 2018

(54) INTEGRATED CHARACTERIZATION CIRCUIT

(71) Applicant: Apple Inc., Cupertino, CA (US)

(72) Inventors: Matthias Knoth, San Jose, CA (US); Conrad H. Ziesler, Seattle, WA (US); Toshinari Takayanagi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 408 days.

(21) Appl. No.: 14/829,392

(22) Filed: Aug. 18, 2015

(65) Prior Publication Data
US 2017/0052219 A1    Feb. 23, 2017

(51) Int. Cl.
*H01L 29/10* (2006.01)
*H01L 21/66* (2006.01)
*G01R 19/25* (2006.01)
*G01R 19/00* (2006.01)

(52) U.S. Cl.
CPC ..... *G01R 19/2509* (2013.01); *G01R 19/0084* (2013.01)

(58) Field of Classification Search
CPC .................................................. H04R 2225/39
USPC .......................................... 438/14–17; 257/48
See application file for complete search history.

(56) References Cited

U.S. PATENT DOCUMENTS

| | | | |
|---|---|---|---|
| 6,211,803 B1 * | 4/2001 | Sunter | H03M 1/109 341/118 |
| 6,337,651 B1 | 1/2002 | Chiang | |
| 8,243,852 B1 | 8/2012 | Summerfield | |
| 8,442,697 B2 | 5/2013 | Schmitz et al. | |
| 8,929,497 B2 * | 1/2015 | Chmelar | H04L 25/03057 375/355 |

* cited by examiner

*Primary Examiner* — Calvin Lee
(74) *Attorney, Agent, or Firm* — Meyertons, Hood, Kivlin, Kowert & Goetzel, P.C.; Lawrence J. Merkel

(57) ABSTRACT

In an embodiment, an integrated circuit includes a first circuit and a characterization circuit to capture a histogram of the supply voltage magnitude to the first circuit (or other characteristics of the first circuit). In various embodiments, the characterization circuit may: be located near the first circuit; include a sample/hold circuit that may sample the supply voltage in a short window of time and an ADC that is configured to converge to the sampled voltage over multiple orders of magnitude longer than the short window; be relatively small and low power; capture multiple histograms, e.g. one for each mode of the first circuit; support a blackout interval during mode changes; support a zoom feature to a subrange of supply voltage disabled with fine-grain histogram buckets; and/or include one or more comparators to detect maximum and/or minimum voltages experienced over a time interval.

19 Claims, 5 Drawing Sheets

INTEGRATED CHARACTERIZATION CIRCUIT

BACKGROUND

Technical Field

Embodiments described herein are related to monitoring power supply voltages in an integrated circuit Description of the Related Art The supply voltage to an integrated circuit is nominally a constant-magnitude voltage. Real power supplies, however, can provide supply voltages that vary in magnitude base on instantaneous current demands of the circuit and the capabilities of the power supply that generates the supply voltage. For example, a large instantaneous current draw may cause the supply voltage to droop (reduced voltage magnitude). A rapid decrease in the current draw may cause overshoot (increased supply voltage magnitude). Viewing the variations in load and supply voltage magnitude in the frequency realm, significant frequency components at resonant frequencies of the integrated circuit, its packaging, and/or related circuitry can cause oscillation ("ringing") on the supply voltage.

Supply voltage variation is modeled as part of the design process for an integrated circuit, but the complexity of the problem and the many sources of information needed to perform the analysis make the model inherently inaccurate. Complexities include variations in integrated circuit load, clock frequency which can change dynamically during operation, power supply characteristics, etc.

In some cases, fast analog to digital converters (ADCs) mounted on a circuit board with the packaged integrated circuit have been used to measure supply voltage characteristics in real time. Software may be executed to periodically read the ADC samples and form a representation of the variation in the supply voltage. However, when the integrated circuit can dynamically change modes (e.g. supply voltage magnitude and clock frequency settings), the measurements cannot be correlated to the mode in which the integrated circuit was operating. Additionally, the location of the ADC on the board prevents observation of the behavior of the power supply voltage at the integrated circuit semiconductor die, due to package parasitics that limit high frequency changes from being observed external to the package.

SUMMARY

In an embodiment, an integrated circuit includes one or more circuits that provide the operational features of the integrated circuit (e.g. a processor such as a CPU or GPU, a memory controller, other peripherals, etc.). The embodiment may further include a characterization circuit that is configured to monitor the supply voltage to at least a first circuit of the one or more circuits and to capture a histogram of the supply voltage magnitude during operation of the integrated circuit. The characterization circuit may be located near the first circuit (e.g. within the semiconductor die area occupied by the first circuit), and may thus provide an accurate measurement of the power supply network in the first circuit. The characterization circuit may include a sample/hold circuit that may sample the supply voltage in a short window of time (e.g. within a clock cycle of the first circuit) and an ADC that is configured to converge to the sampled voltage over a longer period of time (e.g. multiple orders of magnitude longer than the short window for the sampled voltage). The ADC may be relatively small and low power, limiting the area impact and power consumption of the characterization circuit while still providing a reasonably accurate instantaneous sample. In other embodiments, the characterization circuit may monitor other characteristics of the circuit and may capture histograms of the monitored characteristics.

In an embodiment, the characterization circuit may capture multiple histograms, e.g. one for each mode of the first circuit. Accordingly, per-mode supply voltage behavior may be observed. There may be no constraints on the workload of the integrated circuit, and modes may change during operation. In one embodiment, the characterization circuit may support a blackout interval during mode changes, in which no samples are taken. The spurious samples that would be captured while the supply voltage magnitude is changing may be eliminated from the histograms. Alternatively, the same workload may be executed with the blackout interval enabled and disabled, to characterize supply voltage behavior during the transition between modes. In an embodiment, the characterization circuit may provide coarse-grain histogram "buckets" over a wide range of voltage magnitudes, and may also support a zoom to a subrange with fine-grain histogram buckets.

In addition to the histogram capture, some embodiments of the characterization circuit may include one or more comparators to detect maximum and/or minimum voltages experienced over a time interval. The comparators may compare the sampled voltages to a predetermined reference voltage and may count occurrences in which the reference voltage is exceeded (in the maximum or minimum direction). The comparators may also compare the sampled voltages to a maximum and minimum captured voltage, to capture new maximum and minimum samples. Timestamps may also be recorded for such maximum and minimum voltages, so that the workload that was active at the time of the occurrence may be detected.

BRIEF DESCRIPTION OF THE DRAWINGS

The following detailed description makes reference to the accompanying drawings, which are now briefly described.

Figure 1:
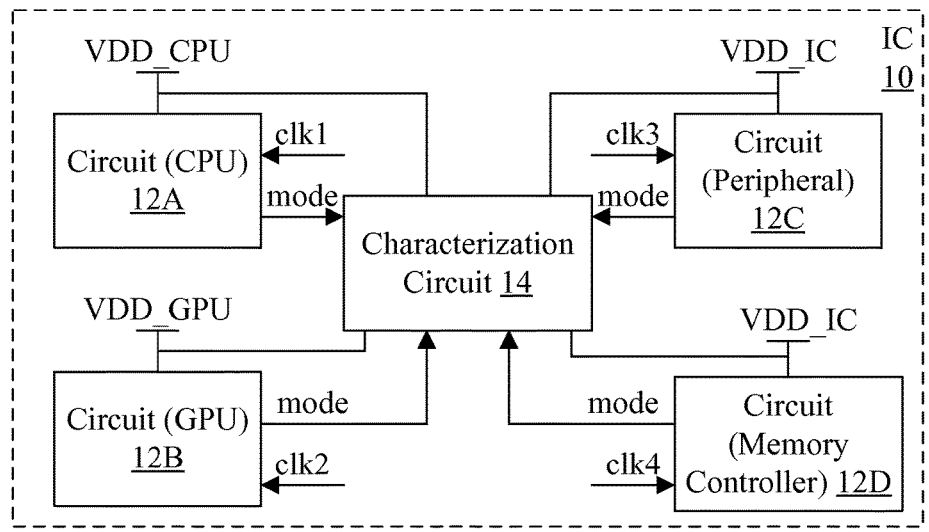
FIG. 1 is a block diagram of one embodiment of an integrated circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, programmable logic arrays, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Turning now to FIG. 1, a block diagram of one embodiment of an integrated circuit (IC) 10 is shown. The IC 10 includes various circuits 12A-12D coupled to a characterization circuit 14. The circuits 12A-12D may provide the operational features of the IC 10. That is, the circuits 12A-12D may implement the operation for which the IC 10 is designed. In the illustrated embodiment, the circuits 12A-12D include processors. For example, one or more general purpose processors may form a central processing unit (CPU) (circuit 12A). One or more graphics processors may form a graphics processing unit (GPU) (circuit 12B). Other circuits may include, e.g., a memory controller (circuit 12D) and/or various peripherals or peripheral interface circuits (circuit 12C). Each circuit 12A-12D is supplied by a supply voltage, shown in FIG. 1 as VDD_CPU to the circuit 12A, VDD_GPU to the circuit 12B, and VDD_IC to the circuits 12C-12D. Each differently labeled VDD have an independent voltage magnitude setting. The voltages may be independently turned on and off as well, and in some embodiments circuits receiving the same voltage (e.g. the circuits 12C-12D) may also implement power gating to independently power down while other circuits receiving the same voltage are powered up and operating. Each circuit 12A-12C is also supplied a clock (clk1 to clk4 in FIG. 1) generated clock generation circuitry (not explicitly shown in FIG. 1) such as one or more phase locked loops, clock divider circuits, etc.

The characterization circuit 14 is coupled to receive the supply voltages from those circuits 12A-12D that it monitors. Any subset of the supply voltages may be monitored, in various embodiments. The characterization circuit 14 may be configured to sample the monitored supply voltages and to capture a histogram of the samples over a defined measurement period. The measurement period may begin at power up of the IC 10, may be triggered by software writing a register in the characterization circuit 14 to enable the measurement period, may be triggered by a programmable event to be detected by the characterization circuit 14, etc. The length of the measurement period may be any desired length, and may be programmable in the characterization circuit 14 as well. The length of the measurement period, as compared to the interval between samples, may be sufficiently large to ensure that a statistically valid representation of the behavior of the supply voltage magnitude is captured in the histogram.

In an embodiment, the histograms may be used to optimize system component design, such as power supply regulators, on-die supply networks and bulk capacitance. Additionally, supply histograms for the processor circuits (e.g. CPU, GPU circuits 12A-12B) may be used by the operating system scheduler to optimize CPU load and distribution of CPU load, because the utilization of each CPU relative to its current performance state become accessible for active modulation.

Additionally, the characterization circuit 14 may be coupled to receive mode signals from the monitored circuit 12A-12D. The mode signals may indicate one of multiple modes in which the circuit 12A-12D may operate, and the characterization circuit may be configured to capture different histograms for each mode. The modes may include different supply voltage magnitude and clock frequency settings (referred to as dynamic voltage and frequency management, or DVFM, states). Within a given DVFM state, there may be multiple modes in which the activity of the circuit is restricted to prevent certain high current demand events, in exchange for operating at a lower supply voltage magnitude at the same operating frequency, in some embodiments. By ensuring that the high current demand events do not occur, some of the voltage margin provide to ensure proper operation during those events may be recovered in the reduced power supply voltage magnitude. These modes within a given DVFM state may thus be referred to as dynamic voltage margin recovery (DVMR) states.

It is noted that, while the characterization circuit 14 is illustrated as a separate block in FIG. 1, the characterization circuit 14 may actually be implemented in a distributed fashion, with the circuitry monitoring the supply voltage of a given circuit 12A-12D being located close to the given circuit 12A-12D. In an embodiment, for example, the portion of the characterization circuit 14 that monitors the given circuit 12A-12D may be located within the semiconductor die area that is occupied by that given circuit 12A-12D. It is further noted that, while the characterization circuit 14 described in more detail herein characterizes supply voltage magnitudes, other embodiments may characterize any characteristic or attribute of a given circuit 12A-12D. For example, embodiments are contemplated that monitor on-die temperature, frequency components of supply voltage noise, power estimation (e.g. digital power estimation), cache miss rate, etc. In each case, a sample circuit may be provided to sample the characteristic and a histogram circuit may be provided to collect the samples in histograms. Any set of one or more characteristics may be characterized, in various embodiments.

Figure 2:
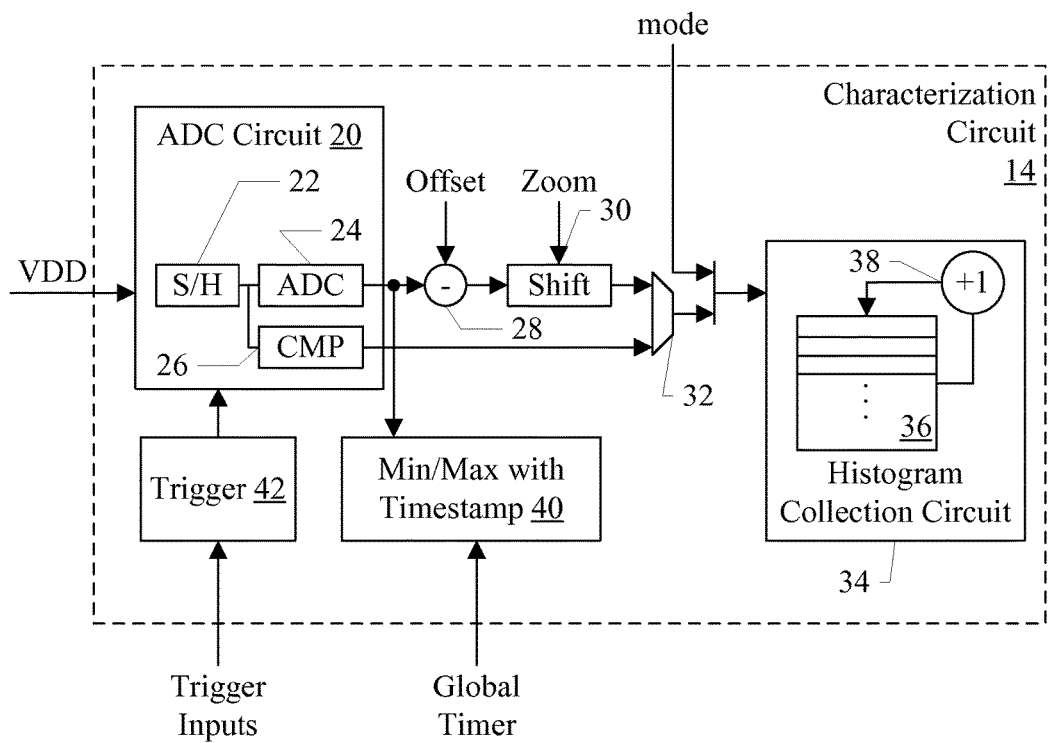
FIG. 2 is a block diagram of one embodiment of a characterization circuit shown in FIG. 1.

Turning next to FIG. 2, a block diagram of one embodiment of the characterization circuit 14 is shown. Instances of the components illustrated in FIG. 2 may be provided for each circuit 12A-12D that is monitored in various embodiments. In the illustrated embodiment, the characterization circuit 14 may include an ADC circuit 20, including a sample/hold (S/H) circuit 22, an ADC 24, and an analog comparator (CMP) 26. The ADC circuit 20 is coupled to the supply voltage network for the circuit 12A-12D being monitored (VDD input in FIG. 2). For example, if the instance is monitoring the circuit 12A, the VDD input may be coupled to VDD_CPU. More specifically, the S/H circuit 22 may be coupled to the VDD input. The output of the S/H circuit 22 may be coupled as an input to the ADC 24 and the comparator 26.

The S/H circuit 22 may be configured to sample the VDD voltage over a relatively short period of time, approximating an instantaneous sample. For example, the window of time may be within a range of the period of the clock that is provided to the circuit being monitored (at its highest supported clock frequency). In an embodiment, the sample period may be approximately 1 nanosecond (ns) or less than 1 ns.

The ADC 24 may be configured to converge to the digital value that best represents the sampled voltage magnitude over a relatively long period of time (e.g. on the order of 1 microsecond (µs)). Generally, the convergence period of the ADC 24 may be multiple orders of magnitude greater than the sample period of the S/H circuit 22. The ADC 24 may be made relatively small and low power, limiting the overall area and power impact of the ADC circuit 20, in some embodiments. The capture period of the ADC circuit 20 may be less than or equal to the convergence period of the ADC 24, and thus the capture frequency may be significantly lower than the clock frequency of the clock to the monitored circuit 12A-12D. In an embodiment, the capture frequency may be selected to be uncorrelated to the clock frequency of the clock to the monitored circuit 12A-12D. Over a relatively long measurement period, the histogram may represent a statistically-valid view of the behavior of the supply voltage.

The output of the ADC 24 may be coupled to a subtractor 28, which may subtract an optional offset to the ADC value when zoom operation is used. The output of the subtractor 28 may be coupled to the shifter 30, which may be configured to shift the ADC value for zoom operation. Zoom operation is described in more detail below. The output of the shifter 30 is coupled to an input of a multiplexor (mux) 32, the output of which is coupled to a histogram collection circuit 34. The ADC 24 value, potentially modified by the subtractor 28 and the shifter 30, may be selected through the mux 32 during histogram collection.

In the illustrated embodiment, the histogram collection circuit 34 includes a histogram memory 36 coupled to an incrementor 38. The histogram memory 36 may include any sort of memory, e.g. registers, flop arrays, SRAM, multiple SRAMs, etc. The histogram memory 36 may be organized as a set of entries, addressed by the output of the mux 32 concatenated with the mode signals from the monitored circuit 12A-12D. Thus, the address of the histogram collection circuit 34 is different depending on the mode, and depending on the ADC value provided by the ADC circuit 20 (ADC 24). The addressed entry may be read, the histogram count stored in the entry may be incremented by the incrementor 38, and the result may be written back to the entry. Thus, each entry may store a count for one of the buckets in the histogram. In some embodiments, a given entry may store more than one bucket count. In such a case, the most significant bits of the address may select an entry, and the least significant bit or bits (LSBs) may select one of the counts in the entry. The incrementor 38 may saturate at the maximum representable value in the bucket, so that the count does not overflow and return to zero.

The ADC 24 may capture a range of supply voltage magnitudes. It is possible that the range may be insufficient to cover the complete range of voltage magnitudes sampled by the S/H circuit 22 during operation. The comparator 26 may be provided to detect out of range voltages. In an embodiment, the comparator 26 may be provided with a reference voltage to which the sample voltage from the S/H circuit 22 may be compared. The reference voltage may be the minimum voltage detected by the ADC 24, and thus the comparison may detect when the minimum voltage is exceeded (i.e. the sampled voltage magnitude is lower than the reference voltage magnitude). Similarly, the reference voltage may be the maximum voltage detected by the ADC 24, and the comparison may detect when the maximum voltage is exceeded (i.e. the sample voltage magnitude is higher than the reference voltage magnitude). Alternatively, the comparator 26 may be two comparators to detect both maximum and minimum extrema. The samples that exceed the thresholds may be counted and compared to the sample counts in the histogram to evaluate the coverage of the histogram.

When the comparator output is selected through the mux 32 (and concatenated with the mode signals), the output may be an address into the histogram memory 36. Since the comparator output is either 0 or 1, the first two histogram buckets for a given mode may be used to accumulate counts for the comparator.

In an embodiment, the comparator 26 may be used to set the high and low boundaries of the histogram by running the workload to be measured with progressively lower minimum reference voltage magnitudes (for the low voltage end) and progressively higher maximum reference voltage magnitudes (for the high voltage end) until the counts of voltages that exceed the maximum/minimum are below a desired level. Then the workload may be run again to capture the histogram over the range between the minimum voltage that provides the desired count and the maximum voltage that provides the desired count. Few sampled supply voltages will lie outside the range covered by the histogram when this process is followed. Alternatively, over multiple devices, a statistical characterization of device behavior may be formed based on the observed maxima and minima detected by the comparator 26. The resulting characterization may be used to judge the quality of the histograms based on the their coverage of the range between the statistical maxima and minima.

In an embodiment, the characterization circuit 14 may be configured to capture the maximum and minimum sampled supply voltage magnitude, along with a timestamp for when the maximum/minimum occurs. The min/max with timestamp circuit 40 may be coupled to the output of the ADC 24, and may compare the ADC value to the most recently captured maximum and minimum. If the ADC value is greater than the maximum or less than the minimum, the ADC value may replace the most recently captured maximum or minimum, respectively. Additionally, the timestamp from a global timer within the IC 10 (input shown in FIG. 2) may concurrently be captured. The timestamp at which the minimum or maximum occurred may be used to correlate the minimum/maximum supply voltage magnitude to activity in the monitored circuit 12A-12D.

The ADC circuit 20 may be configured to capture a broad range of voltage magnitudes using a set of histogram buckets. Thus, each bucket may cover multiple VDD measurements, and the granularity of the histogram may be coarse. In an embodiment, the characterization circuit 14 may support a zoom feature in which the same number of buckets is used to cover a narrower range to which the characterization circuit 14 has been programmed to "zoom". The low end of the range may be programmed as an offset, and the offset may be subtracted from the ADC value provided by the ADC 24. The subtractor 28 may saturate at zero. Thus, an ADC value less than or equal to the offset is detected as zero, an ADC value of offset plus one is detect as one, etc. The shifter 30 may be configured to shift the resulting value. For coarse grain, wide histograms, the shifter may shift the ADC value to the right, using the most significant bits (MSBs) of the ADC value and collapsing multiple ADC values into each bucket. For fine-grain, narrow histograms, less right shift may be used up until no right shift being performed for the finest-grain, narrowest histogram in which each ADC value is a separate bucket.

As an example, the ADC 24 may be 10 bits (and the offset may be 10 bits as well), and there may be 64 buckets of histogram per mode. Accordingly, a 6 bit address may be generated from the ADC values to identify one of the 64 buckets (and the mode bits may be used to select a histogram). The 10 bits may not be shifted for the finest-grain, narrowest histogram (and the 6 LSBs may be used as the index). If any of the unused MSBs are non-zero, the index may be selected as the highest numbered bucket, which may be an overflow count in the histogram. For the coarsest grain histogram, the ADC values may be shifted by 4 bits (collapsing 16 adjacent ADC values into each bucket). The 6 LSBs of the shifted value (which are the 6 MSBs of the unshifted value) may form the index. Similarly, right shifts of 1, 2, or 3 bits may be used for different levels of zoom. Any number of bits of ADC, buckets, zoom levels, etc. maybe used.

In an embodiment, the measurement interval for the characterization circuit 14 may be controlled by a trigger mechanism implemented by the trigger circuit 42 coupled to the ADC circuit 20. Such a configuration may permit the measurement interval to be tuned to desired portions of the workload (e.g. "critical" sections of the workload where supply voltage stress is expected to be higher than other sections). The trigger circuit 42 may be coupled to various trigger inputs to control the start and stop of the measurement interval. For example, one trigger (start, stop, or both) may be a write to a designated address by software executing in the IC 10. Other events may also be triggers, e.g. interrupts, performance state events, or power switch control events. The trigger circuit 42 may support a delay to the start, such that the measurement interval begins a programmable number of clock cycles after the trigger event is received. The length of the measurement interval may also be programmed into the trigger circuit 42 to serve as a stop trigger.

In an embodiment, the trigger circuit 42 may be used to generate a high frequency waveform of the supply voltage magnitude instead of the histogram. Each time the trigger occurs, the start delay may be increased by one clock and the length may be one sample. Thus, the trigger may be set to occur at a particular point in a repeating workload, and sampled that are one clock cycle apart may be captured in the histogram buckets.

In another embodiment, other data sources may be captured in a similar fashion. For example a temperature histogram may be generated by using temperature as an input to the characterization circuit 14.

Figure 3:
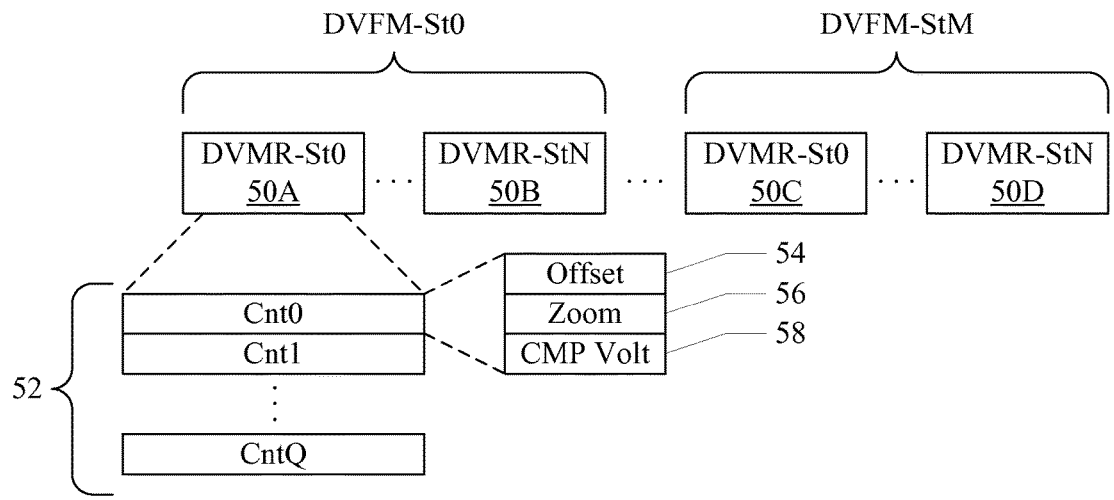
FIG. 3 is a block diagram of one embodiment of an organization of data within a histogram memory shown in FIG. 2.

Turning next to FIG. 3, a block diagram of one embodiment of an arrangement of data in the histogram memory 36 is shown. In the illustrated embodiment, the lowest-numbered address may be to the right and increasing addresses to the left. The data may include multiple histograms 50A-50D (and additional histograms indicated by the ellipses in FIG. 3). Each histogram 50A-50D is associated with a different mode of the monitored circuit 12A-12D. In this embodiment, the modes are combinations of DVFM states and DVMR states. In particular, there are M+1 DVFM states (DVFM-St0 to DVFM-StM in FIG. 3). Each DVFM state may include a supply voltage magnitude/clock frequency pair for to the monitored circuit 12A-12D. With each DVFM state, there are N+1 DVMR states (DVMR-St0 to DVMR-StN in FIG. 3). Each DVMR state may include a reduced supply voltage magnitude (as compared to the supply voltage magnitude in the corresponding DVFM state) along with activity controls that may be placed on the monitored circuit 12A-12D to ensure proper operation with the reduced supply voltage magnitude. For purposes of address the histogram memory 36, the DVFM state number (0 to M) and the DVMR state number (0 to N) may be concatenated as the mode signals in this embodiment, with the DVFM state number forming the MSBs of the concatenated value and the DVMR state forming the LSBs of the concatenated value.

The histogram 50A is illustrated in exploded view in FIG. 3 to include Q+1 buckets 52, each storing a count corresponding to the bucket (Cnt0 to CntQ in FIG. 3). As mentioned previously, the ADC values (possibly modified by the offset and zoom shift) may select the bucket in which to modify the count. In the illustrated embodiment, the Cnt0 bucket may be used to store configuration information for the mode and thus the counts may be stored in the Cnt1 to CntQ buckets. Buckets Cnt1 and Cnt2 may be used when the comparator 26 results are being counted. Cnt1 and CntQ may be underflow and overflow buckets for the histogram, respectively. The remaining buckets may correspond to one or more ADC values according to the zoom settings.

The Cnt0 bucket is shown in exploded view to include the offset and zoom settings for the mode (reference numerals 54 and 56, respectively). When the mode is selected, the characterization circuit 14 may read the Cnt0 bucket for the mode and establish the offset and zoom settings 54 and 56. Additionally, other configuration data may be stored in Cnt0 bucket. For example, a value or values identifying the reference voltage or voltages to be selected for the comparator 26 may be stored in the entry. Any set of configuration data may be used in various embodiments.

Figure 4:
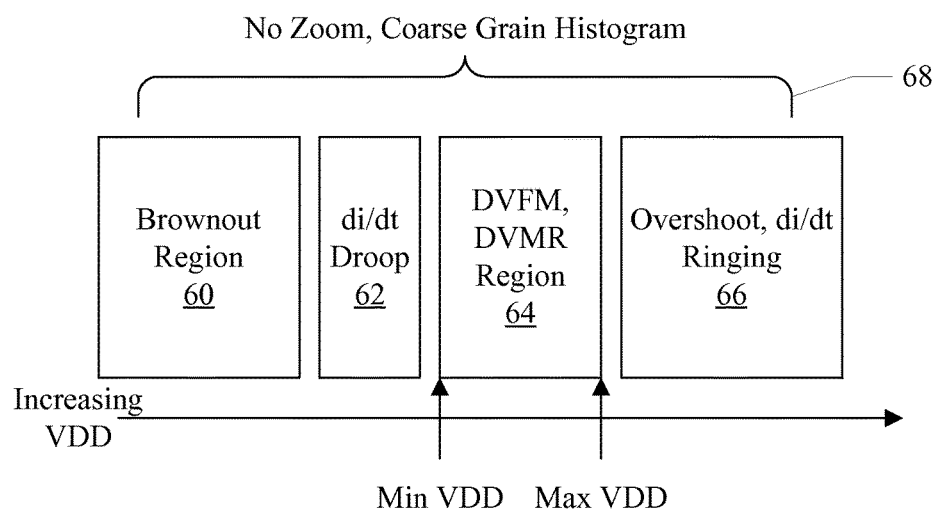
FIG. 4 is a block diagram of one embodiment of histogram coverage without zoom.

FIG. 4 is a block diagram illustrating histogram coverage of a supply voltage VDD, when zoom is not used, for an embodiment. VDD magnitude may increase from left to right in the diagram. Thus, the lowest VDD magnitudes may be too low for operation of the integrated circuit 10 (brown out region 60). The region 64 between the minimum nominal VDD and the maximum nominal VDD may be the "normal operating range" to which the monitored circuit 12A-12D is designed. Various DVFM and DVMR states may exist within the region 64. Surrounding the region 64 may be regions that may be entered briefly during times of high current change (di/dt droop region 62, in which VDD is temporarily lower, and overshoot region 66, for VDD that is temporarily higher).

When zoom is not selected, a wide range of the VDD magnitude may be captured by the histogram (reference numeral 68). For example, in FIG. 4, sections of the overshoot region 66 and the brownout region 60 may be covered, as well as the regions 62 and 64. In some embodiments, the entirety of regions 60 through 66 may be covered. With the broad coverage, each histogram bucket covers a relatively broad set of voltage magnitudes. Thus, the histogram may be coarse-grain.

Figure 5:
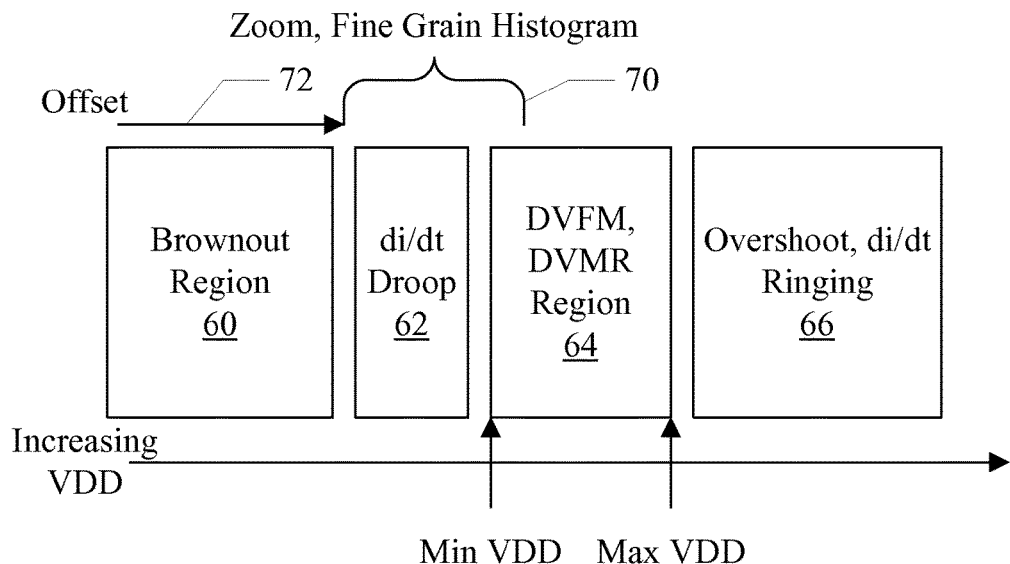
FIG. 5 is a block diagram of one embodiment of histogram coverage with zoom.

FIG. 5, on the other hand, illustrates an embodiment of a fine-grain zoom of a smaller section of the VDD magnitude range. The same regions 60 through 66 from FIG. 4 are illustrated in FIG. 5. In the example of FIG. 5, the histogram 70 covers the di/dt droop region 62 and a portion of the region 64. The base of the histogram is indicated by the offset 72. Each bucket in the histogram may cover a narrower range of VDD magnitude, compared to FIG. 4, since the same number of buckets may be used for a narrower region.

Figure 6:
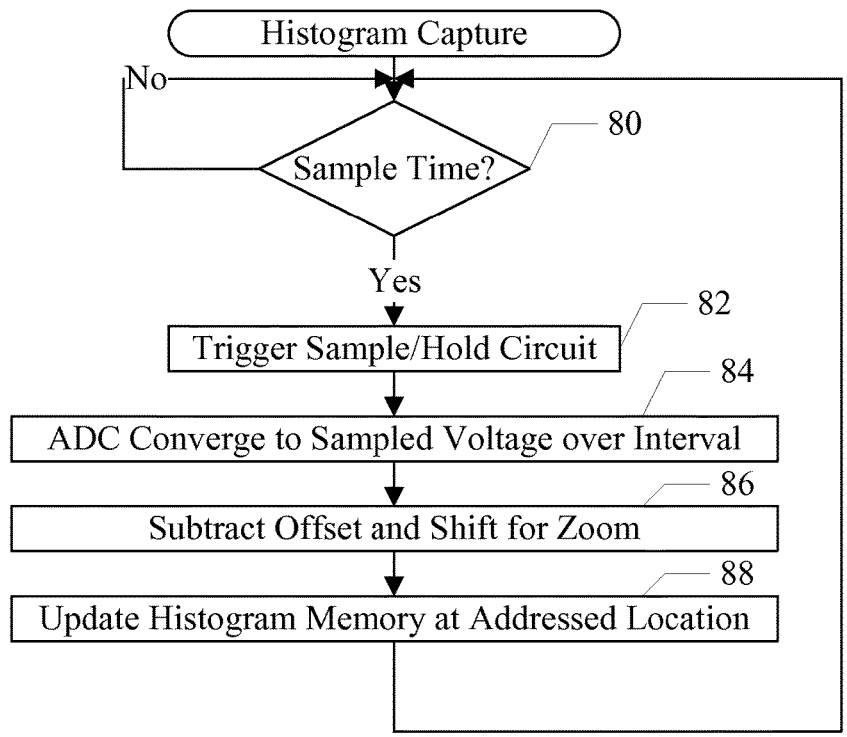
FIG. 6 is a flowchart illustrating operation of one embodiment of the characterization circuit to capture a histogram of supply voltage magnitudes.

FIG. 6 is a flowchart illustrating operation of one embodiment of the characterization circuit 14 to capture a histogram of supply voltage magnitude values. While the blocks are shown in a particular order for ease of understanding, other orders may be used. Blocks may be performed in parallel in combinatorial logic in the characterization circuit 14. Blocks, combinations of blocks, and/or the flowchart as a whole may be pipelined over multiple clock cycles. The characterization circuit 14 and/or components thereof may be configured to implement the operation illustrated in FIG. 6.

If capture period has expired (decision block 80, yes leg), it is time to capture a new sample of the monitored supply voltage magnitude. The characterization circuit 14 may cause the sample/hold circuit 22 to sample the supply voltage (block 82). The ADC 24 may converge to the sampled value over the capture period (block 84) and may output the digital representation of the sample to the subtractor 28. The subtractor 28 may subtract the offset and the shifter 30 may shift the result from the subtractor 28 according to the zoom (block 86). The histogram memory 36 may output the count at the location addressed by the offset and shifted ADC value, which may be updated by incrementing the count in the incrementor 38 and writing the results back to the histogram memory 36 (block 88).

Figure 7:
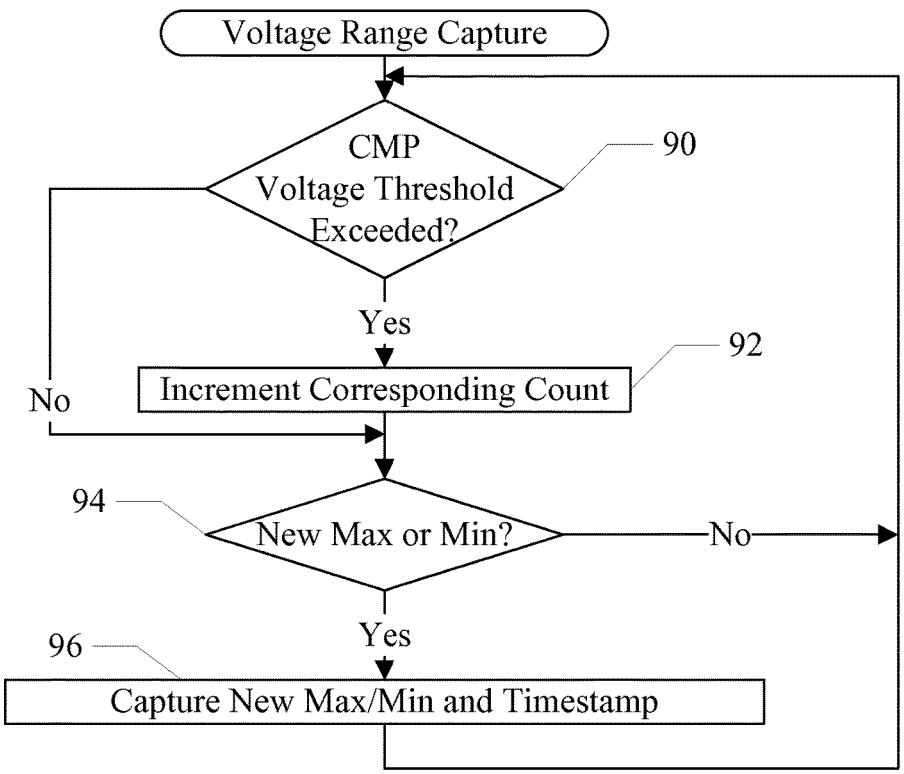
FIG. 7 is a flowchart illustrating operation of one embodiment of the characterization circuit to capture voltage range data.

FIG. 7 is a flowchart illustrating operation of one embodiment of the characterization circuit 14 to capture a range of supply voltage magnitude values. While the blocks are shown in a particular order for ease of understanding, other orders may be used. Blocks may be performed in parallel in combinatorial logic in the characterization circuit 14. Blocks, combinations of blocks, and/or the flowchart as a whole may be pipelined over multiple clock cycles. The characterization circuit 14 and/or components thereof may be configured to implement the operation illustrated in FIG. 7.

If the comparator 26 detects that the supply voltage magnitude exceeds a reference (threshold) voltage magnitude (decision block 90, "yes" leg), the characterization circuit may increment the corresponding count (block 92). A supply voltage magnitude may exceed a reference voltage magnitude when it is greater than the reference voltage magnitude, if the reference voltage magnitude is a maximum threshold. Alternatively, a supply voltage magnitude may exceed a reference voltage magnitude when it is less than the reference voltage magnitude, if the reference voltage magnitude is a minimum threshold. In one embodiment, there may be counts for the maximum threshold and the minimum threshold, in buckets 1 and 2 of the histogram as mentioned previously.

If the min/max with timestamp circuit 40 is actively tracking the maximum and minimum captured voltage magnitudes, the circuit 40 may compare the captured voltage magnitude from the ADC 24 to the currently-maintained minimum and maximum. If a new minimum or maximum is detected (decision block 94, "yes" leg), the circuit 40 may capture the new maximum or minimum (overwriting the previously captured maximum or minimum, respectively) and may capture a timestamp from the global timer (block 96).

Figure 8:
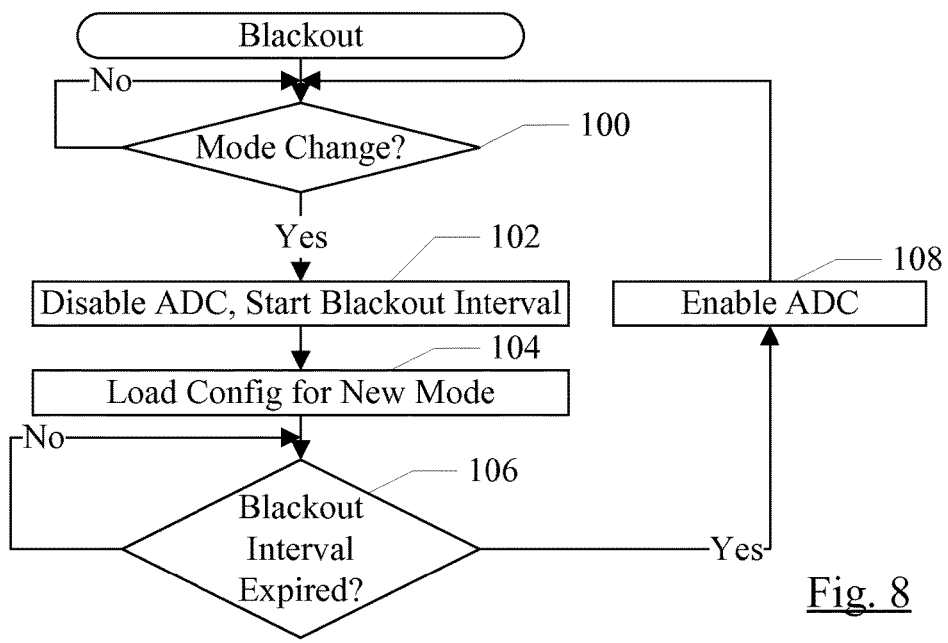
FIG. 8 is a flowchart illustrating operation of one embodiment of the characterization circuit to implement a blackout interval.

FIG. 8 is a flowchart illustrating operation of one embodiment of the characterization circuit 14 to apply a blackout interval in the capture of a histogram of supply voltage magnitude values. While the blocks are shown in a particular order for ease of understanding, other orders may be used. Blocks may be performed in parallel in combinatorial logic in the characterization circuit 14. Blocks, combinations of blocks, and/or the flowchart as a whole may be pipelined over multiple clock cycles. The characterization circuit 14 and/or components thereof may be configured to implement the operation illustrated in FIG. 8.

If a mode change occurs, the characterization circuit 14 may start a blackout interval during which the histogram may not be updated, to avoid spurious measurements that are really part of the voltage transition to the new magnitude. As mentioned above, the length of the blackout interval may be programmable. In one embodiment, the mode change may be directly signalled to the characterization circuit 14 (e.g. by software writing a register in the characterization circuit 14, or by hardware expressly including a mode change signal). Alternatively, the characterization circuit 14 may detect a change in the mode signals that indicate the current mode to detect the mode change. If a mode change is detected (decision block 100, "yes" leg), the characterization circuit 14 may disable the ADC 24 and start the blackout interval (block 102). The characterization circuit 14 may also use the new mode to select the histogram associated with the new mode from the histogram memory 36 and may load the configuration from bucket 0 of the histogram (block 104). Once the blackout interval expires (decision block 106, "yes" leg), the characterization circuit 14 may enable the ADC 24 (block 108) and begin capturing histogram in the new mode.

Figure 9:
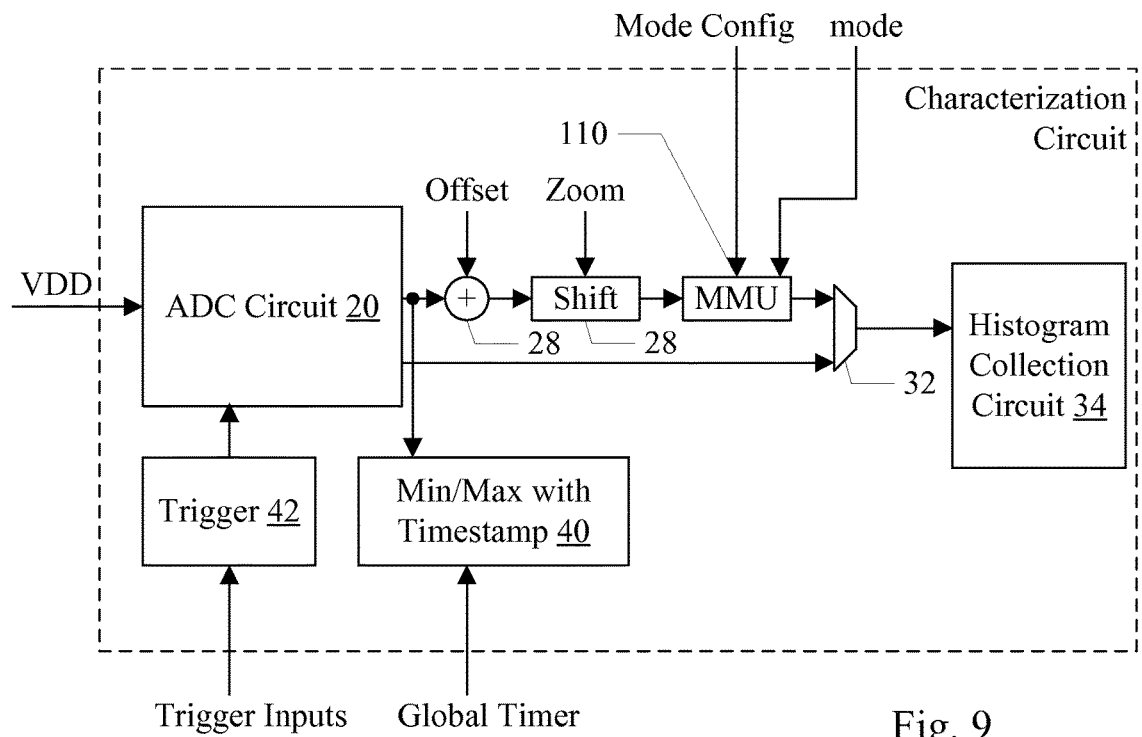
FIG. 9 is a block diagram of another embodiment of the characterization circuit shown in FIG. 1.

FIG. 9 is another embodiment of the characterization circuit 14, including the ADC circuit 20 (including components similar to FIG. 2, components not shown in FIG. 9), the subtractor 28, the shift circuit 30, the trigger circuit 42, and the min/max with timestamp circuit 40 coupled in a similar fashion to FIG. 2 and operating in a similar fasion. The output of the shift circuit is coupled to a memory management unit (MMU) 110, which is coupled to receive a mode configuration. The MMU 110 is coupled to the mode signals from the monitored circuit 12A-12D, and the output of the MMU 110 is an input to the mux 32 and is selected when histogram generation is performed. The output of the mux 32 is coupled to the histogram circuit 34, which may include components similar to the histogram classification circuit 34 in FIG. 2 (components not shown in FIG. 9).

In some embodiments, the monitored circuit 12A-12D may support more modes than the number of histograms that may be concurrently collected by the histogram collection circuit 34. In other embodiments, only certain modes may be of interest for histogram measurement. In such embodiments, the characterization circuit 14 may be configured (by programming the mode configuration into the MMU 110) to assign the desired modes to specified histograms. The MMU 110 may translate the current mode (indicated by the mode control signals) and the output of the shift circuit 30 to select the correct entry in the correct histogram to record the data. In one embodiment, the mode signals may be translated to select the corresponding histogram and the output of the shift circuit 30 may be passed through the MMU unmodified.

System

Figure 10:
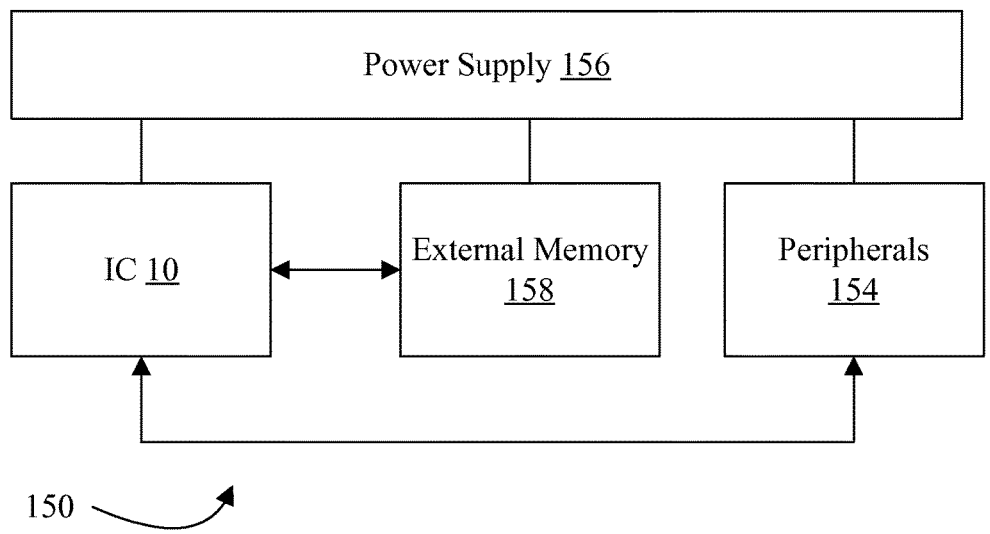
FIG. 10 is a block diagram of one embodiment of a system including the integrated circuit shown in FIG. 1.

Turning next to FIG. 10, a block diagram of one embodiment of a system 150 is shown. In the illustrated embodiment, the system 150 includes at least one instance of the integrated circuit 10 coupled to one or more peripherals 154 and an external memory 158. A power supply 156 is provided which supplies the supply voltages to the IC 10 as well as one or more supply voltages to the memory 158 and/or the peripherals 154. In some embodiments, more than one instance of the IC 10 may be included (and more than one memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, low power versions of the DDR DRAM (e.g. LPDDR, mDDR, etc.), etc. The external memory 158 may include one or more memory modules to which the memory devices are mounted, such as single inline memory modules (SIMMs), dual inline memory modules (DIMMs), etc. Alternatively, the external memory 158 may include one or more memory devices that are mounted on the SOC 152 in a chip-on-chip or package-on-package implementation.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a first circuit configured to provide one or more operational features of the integrated circuit; and
a characterization circuit integrated into a semiconductor substrate of the integrated circuit with the first circuit and coupled to the first circuit, wherein the characterization circuit is configured to monitor at least one characteristic of the first circuit, the characterization circuit comprising:
a sample circuit configured to periodically sample the characteristic; and
a histogram collection circuit coupled to the sample circuit and configured to accumulate a histogram of the samples of the characteristic over a measurement interval, wherein the histogram collection circuit comprises a memory including a plurality of entries storing histogram values during use, and wherein the histogram circuit is configured to increment a first histogram value in a selected one of the plurality of entries responsive to a sample of the characteristic received from the sample circuit, wherein a number of samples accumulated by the histogram collection circuit greater than or equal to a predetermined number represents a characteristic profile of the at least one characteristic over the measurement interval.

2. The integrated circuit as recited in claim 1 wherein:
the first circuit is supplied with one or more supply voltages;
a magnitude of a first supply voltage of the one or more supply voltages is the characteristic; and
the sample circuit comprises:
a sample/hold circuit configured to sample the first supply voltage in a first period of time;
an analog to digital converter (ADC) coupled to the sample/hold circuit and configured to converge to the magnitude of the first supply voltage over a second period of time that is a plurality of orders of magnitude longer than the first period of time, wherein magnitudes of the first supply voltage from the ADC at the end of each second period of time over the measurement interval are captured by the histogram collection circuit, wherein the number of samples accumulated by the histogram collection circuit greater than or equal to a predetermined number represents a voltage profile of the first supply voltage over the measurement interval.

3. The integrated circuit as recited in claim 2 wherein the characterization circuit further comprises a comparator configured to compare the supply voltage sampled by the sample/hold circuit to a preselected reference voltage, and wherein the histogram collection circuit is configured to accumulate one or more counts according to the result of the compare.

4. The integrated circuit as recited in claim 2 wherein the characterization circuit is further configured to capture a maximum sampled voltage magnitude and a first timestamp at which the maximum occurred, and further configured to capture a minimum sampled voltage magnitude and a second timestamp at which the minimum occurred.

5. The integrated circuit as recited in claim 2 wherein the characterization circuit is programmable to zoom in to a subrange of supply voltage magnitudes beginning at a programmable offset, wherein the histogram includes finer grained intervals than a non-zoomed histogram.

6. The integrated circuit as recited in claim 2 wherein the first circuit is operable in a plurality of modes, and wherein the histogram collection circuit is configured to collect separate histograms for each of the plurality of modes.

7. The integrated circuit as recited in claim 6 wherein the characterization circuit further includes an address translation circuit to translate addresses to the histogram collection circuit in response to a programmable selection of which of the plurality of modes are to have histograms captured.

8. The integrated circuit as recited in claim 6 wherein the characterization circuit is programmable to cease sampling for a third period of time in response to a change between the plurality of modes.

9. The integrated circuit as recited in claim 6 wherein the plurality of modes include a plurality of pairs of supply voltage magnitude and clock frequencies for the first circuit.

10. The integrated circuit as recited in claim 9 wherein the plurality of modes include, for each of the plurality of pairs of supply voltage magnitudes and clock frequencies, a plurality of reduced voltages and corresponding activity controls for the first circuit.

11. An integrated circuit comprising:
- a first circuit configured to provide one or more operational features of the integrated circuit, wherein the first circuit is supplied with one or more supply voltages; and
- a characterization circuit integrated into a semiconductor substrate of the integrated circuit with the first circuit and coupled to the first circuit, wherein the characterization circuit is configured to monitor a magnitude of a first supply voltage of the one or more supply voltages, the characterization circuit comprising:
  - a histogram collection circuit configured to accumulate a histogram of magnitudes of the first supply voltage sampled a plurality of times over a measurement interval, wherein the first circuit is operable in a plurality of modes, and wherein the histogram collection circuit is configured to collect separate histograms for each of the plurality of modes, wherein the histogram collection circuit comprises a memory including a plurality of entries, and wherein the characterization circuit is configured to derive an address to the memory based on a value identifying an active mode of the plurality of modes, whereby separate subsets of entries in the plurality of entries are allocated to different modes of the plurality of modes.

12. The integrated circuit as recited in claim 11 wherein the characterization circuit is further configured to capture a maximum sampled voltage magnitude and a first timestamp at which the maximum occurred, and further configured to capture a minimum sampled voltage magnitude and a second timestamp at which the minimum occurred.

13. The integrated circuit as recited in claim 11 wherein the characterization circuit further includes an address translation circuit to translate addresses to the histogram collection circuit in response to a programmable selection of which of the plurality of modes are to have histograms captured.

14. The integrated circuit as recited in claim 11 wherein the characterization circuit is programmable to zoom in to a subrange of supply voltage magnitudes beginning at a programmable offset, wherein the histogram includes finer grained intervals than a non-zoomed histogram.

15. The integrated circuit as recited in claim 11 wherein the characterization circuit is programmable to cease sampling for a second period of time in response to a change between the plurality of modes.

16. The integrated circuit as recited in claim 11 wherein the plurality of modes include a plurality of pairs of supply voltage magnitude and clock frequency for the first circuit.

17. The integrated circuit as recited in claim 16 wherein the plurality of modes include, for each of the plurality of pairs of supply voltage magnitude and clock frequency, a plurality of reduced voltages and corresponding activity controls for the first circuit.

18. The integrated circuit as recited in claim 11 wherein the characterization circuit is programmable to generate the separate histograms for a programmable subset of the plurality of modes.

19. The integrated circuit as recited in claim 18 wherein the characterization circuit further includes an address translation circuit to translate addresses to the histogram collection circuit in response to a programmable selection of the subset.

* * * * *